(12) United States Patent
Yoshida

(10) Patent No.: US 11,348,793 B2
(45) Date of Patent: May 31, 2022

(54) LASER PROCESSING APPARATUS AND LASER PROCESSING METHOD

(71) Applicant: DISCO CORPORATION, Tokyo (JP)

(72) Inventor: Yuta Yoshida, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 244 days.

(21) Appl. No.: 15/592,831

(22) Filed: May 11, 2017

(65) Prior Publication Data

US 2017/0338118 A1 Nov. 23, 2017

(30) Foreign Application Priority Data

May 18, 2016 (JP) .............................. JP2016-099747

(51) Int. Cl.
*H01L 21/268* (2006.01)
*B23K 26/06* (2014.01)
(Continued)

(52) U.S. Cl.
CPC ........ *H01L 21/268* (2013.01); *B23K 26/0608* (2013.01); *B23K 26/0676* (2013.01);
(Continued)

(58) Field of Classification Search
CPC ................. H01L 21/268; H01L 23/544; H01L 2223/54453; B23K 26/0608;
(Continued)

(56) References Cited

U.S. PATENT DOCUMENTS 5,632,083 A * 5/1997 Tada .................... B23K 26/032
29/827
2006/0035411 A1 * 2/2006 Oba ................... B23K 26/0736
438/113
(Continued)

FOREIGN PATENT DOCUMENTS

CN 103846547 A * 6/2014
JP 2006-051517 2/2006
(Continued)

OTHER PUBLICATIONS

Machine Translation (EPO/Google) of Description of KR-101298019-B1 that was published Aug. 26, 2013.*
(Continued)

*Primary Examiner* — Cynthia L Schaller
(74) *Attorney, Agent, or Firm* — Greer, Burns & Crain, Ltd.

(57) ABSTRACT

A laser processing apparatus has a laser beam applying unit for applying a laser beam to a workpiece held on a chuck table. The laser beam applying unit includes an elliptical spot forming member for changing the spot shape of a pulsed laser beam into an elliptical shape and making the major axis of the elliptical beam spot parallel to a feeding direction, a diffractive optical element for branching the pulsed laser beam having the elliptical beam spot obtained by the elliptical spot forming member, into a plurality of pulsed laser beams each having an elliptical beam spot whose major axis extends in the feeding direction, and a condensing lens for condensing each of the pulsed laser
(Continued)

beams branched by the diffractive optical element to the workpiece in such a manner that the major axes of the elliptical beam spots of the pulsed laser beams branched are partially overlapped.

8 Claims, 9 Drawing Sheets

(51) Int. Cl.
| | |
|---|---|
| *B23K 26/364* | (2014.01) |
| *B23K 26/067* | (2006.01) |
| *B23K 26/073* | (2006.01) |
| *B23K 26/08* | (2014.01) |
| *B23K 26/402* | (2014.01) |
| *H01L 23/544* | (2006.01) |
| *B23K 101/40* | (2006.01) |
| *B23K 103/00* | (2006.01) |

(52) U.S. Cl.
CPC ........ *B23K 26/0736* (2013.01); *B23K 26/083* (2013.01); *B23K 26/364* (2015.10); *B23K 26/402* (2013.01); *H01L 23/544* (2013.01); *B23K 2101/40* (2018.08); *B23K 2103/56* (2018.08); *H01L 2223/54453* (2013.01)

(58) Field of Classification Search
CPC .............. B23K 26/083; B23K 26/0676; B23K 26/0736; B23K 26/402; B23K 26/364; B23K 2101/40; B23K 2103/56
See application file for complete search history.

(56) References Cited

U.S. PATENT DOCUMENTS

| | | | | |
|---|---|---|---|---|
| 2007/0062917 | A1* | 3/2007 | Fu ...................... | B23K 26/0736 219/121.67 |
| 2007/0109526 | A1* | 5/2007 | Morikazu .......... | B23K 26/0736 355/78 |
| 2008/0245779 | A1* | 10/2008 | Nomaru ............. | B23K 26/0736 219/121.75 |
| 2009/0127477 | A1* | 5/2009 | Tanaka ............... | B23K 26/0738 250/492.22 |
| 2012/0223061 | A1* | 9/2012 | Atsumi .............. | B23K 26/0608 219/121.72 |
| 2018/0126493 | A1* | 5/2018 | Hirano ................. | B23K 26/359 |

FOREIGN PATENT DOCUMENTS

| | | | |
|---|---|---|---|
| JP | 2010194584 | A * | 9/2010 |
| JP | 2010214431 | * | 9/2010 |
| KR | 101298019 | B1 * | 8/2013 |

OTHER PUBLICATIONS

JP-2010194584A Machine Translation of Description (EPO/Google).*
CN103846547A—Machine Translation of Description (Google/EPO) (Year: 2020).*
JP2010214431—Machine Translation of Description (Google/EPO) (Year: 2020).*

* cited by examiner

LASER PROCESSING APPARATUS AND LASER PROCESSING METHOD

BACKGROUND OF THE INVENTION

Field of the Invention

The present invention relates to a laser processing apparatus and a laser processing method for applying a laser beam to a workpiece such as a semiconductor wafer and an optical device wafer to perform ablation to the workpiece.

Description of the Related Art

A plurality of devices such as integrated circuits (ICs), large-scale integrations (LSIs), and light-emitting diodes (LEDs) are formed on the front side of a wafer such as a silicon wafer and a sapphire wafer so as to be separated from each other by a plurality of crossing division lines. The wafer thus having the plural devices is divided into individual device chips along the division lines by a processing apparatus. The device chips divided from the wafer are widely used in various electronic apparatuses such as mobile phones and personal computers. In general, division of the wafer is realized by a dicing method using a cutting apparatus called dicing saw. In the dicing method, a cutting blade having a thickness of approximately 30 µm is rotated at a high speed of 30000 rpm, for example, to cut the wafer. The cutting blade is formed by binding abrasive grains of diamond, for example, with metal or resin. A chuck table holding the wafer is next fed to thereby cut the wafer along each division line by using the cutting blade being rotated, thus dividing the wafer into the individual device chips.

As another method, there has recently been put into practical use a method including the steps of applying a pulsed laser beam having an absorption wavelength to the wafer along each division line by using a laser processing apparatus to thereby form a laser processed groove along each division line and next breaking the wafer along each laser processed groove by using a breaking apparatus to thereby divide the wafer into the individual device chips. The formation of each laser processed groove by the laser processing apparatus can be achieved at a processing speed higher than that in the dicing method using the dicing saw mentioned above. Further, even when the wafer is formed of a hard material having a high Mohs hardness, such as sapphire and SiC, the wafer can be processed relatively easily by the laser processing apparatus. Further, since the width of the laser processed groove can be reduced to 10 µm or less, for example, the number of device chips that can be produced from one wafer can be increased as compared with the case of cutting the wafer by using the dicing method.

However, there is a problem such that the pulsed laser beam must be applied many times along the same division line on the wafer, so as to form a laser processed groove having a desired depth. Further, there is another problem such that the laser processed groove may be clogged with debris produced due to melting of the wafer by the laser beam or a condensed beam spot (focal spot) of the laser beam may not be positioned on the bottom of the laser processed groove previously formed, so that the laser processed groove having a desired depth cannot be efficiently formed. As a method for solving these problems, Japanese Patent Laid-Open No. 2006-51517 discloses a laser processing method which can efficiently form a laser processed groove by making an elliptical shape as the shape of the condensed beam spot to be applied to the wafer.

As one of semiconductor packaging techniques, there has recently been developed and put into practical use a wafer-level chip size package (WL-CSP) technique of forming semiconductor device chips to be used as chip size packages as they are. This WL-CSP technique has a merit such that each semiconductor package can be reduced in size and weight. Accordingly, the width of each division line on the wafer is set very small, so as to increase the number of semiconductor packages per wafer.

SUMMARY OF THE INVENTION

To form a laser processed groove along a narrow division line on a wafer, the above method disclosed in Japanese Patent Laid-Open No. 2006-51517 has been tried to form the laser processed groove by applying a pulsed laser beam having an elliptical beam spot onto the wafer. In the case of using such a pulsed laser beam having an elliptical beam spot, a processing area by the beam spot is wide. However, the peak energy intensity of the pulsed laser beam is reduced to cause a problem such that the laser processed groove may be insufficiently formed. When the power of the pulsed laser beam is increased, so as to sufficiently form the laser processed groove, there arises another problem such that the width of the laser processed groove sufficiently formed may be increased.

It is therefore an object of the present invention to provide a laser processing apparatus and a laser processing method which can form a narrow laser processed groove at a high processing speed.

In accordance with an aspect of the present invention, there is provided a laser processing apparatus including a chuck table for holding a workpiece, laser beam applying means for applying a laser beam to the workpiece held on the chuck table, feeding means for relatively moving the chuck table and the laser beam applying means in a feeding direction, and control means for controlling the laser beam applying means and the feeding means, the laser beam applying means including laser beam generating means for generating a pulsed laser beam, elliptical spot forming means for changing the shape of a beam spot of the pulsed laser beam generated from the laser beam generating means into an elliptical shape and then making the major axis of the elliptical beam spot parallel to the feeding direction, a diffractive optical element for branching the pulsed laser beam having the elliptical beam spot obtained by the elliptical spot forming means, into a plurality of pulsed laser beams each having an elliptical beam spot whose major axis extends in the feeding direction, and a condensing lens for condensing each of the pulsed laser beams branched by the diffractive optical element to the workpiece in such a manner that the major axes of the elliptical beam spots of the pulsed laser beams branched are partially overlapped. Preferably, the elliptical spot forming means includes a cylindrical lens.

In accordance with another aspect of the present invention, there is provided a laser processing method using the laser processing apparatus mentioned above, wherein the workpiece has a plurality of crossing division lines and the laser beam is applied along each division line to form a laser processed groove along each division line, the laser processing method including a holding step of holding the workpiece on the chuck table, a positioning step of arranging the elliptical beam spots of the plural pulsed laser beams branched by the diffractive optical element and condensed by the condensing lens, along each division line of the workpiece in such a manner that the major axes of the elliptical beam spots are partially overlapped, and a feeding step of relatively feeding the plural pulsed laser beams and the chuck table along each division line after performing the positioning step.

According to the present invention, the spot shape of the pulsed laser beam is changed into an elliptical shape, and the resultant elliptical pulsed laser beam having a relatively high power is branched into a plurality of pulsed laser beams. The elliptical beam spots of these plural pulsed laser beams branched are arranged along each division line in such a manner that the major axes of the elliptical beam spots are partially overlapped so as to extend in the feeding direction. In this condition, the pulsed laser beams branched and the workpiece are relatively moved in the feeding direction to thereby form a laser processed groove along each division line of the workpiece. Accordingly, the plural pulsed laser beams branched can be applied as a single elongated elliptical beam spot to each division line of the workpiece, wherein the single elongated elliptical beam spot has a predetermined intensity distribution in the feeding direction.

Accordingly, even when a laser beam having a relatively high power is used, this laser beam is branched into plural laser beams each having a reduced power. Then, these plural laser beams branched are applied as a single elongated elliptical beam spot to the workpiece. As a result, it is possible to prevent the problem that the width of the laser processed groove along each division line may be increased as in the prior art. Further, a narrow laser processed groove can be formed along a narrow division line. Further, since the plural elliptical laser beams branched are applied as a single elongated elliptical beam spot to the workpiece, a laser processing speed can be increased.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
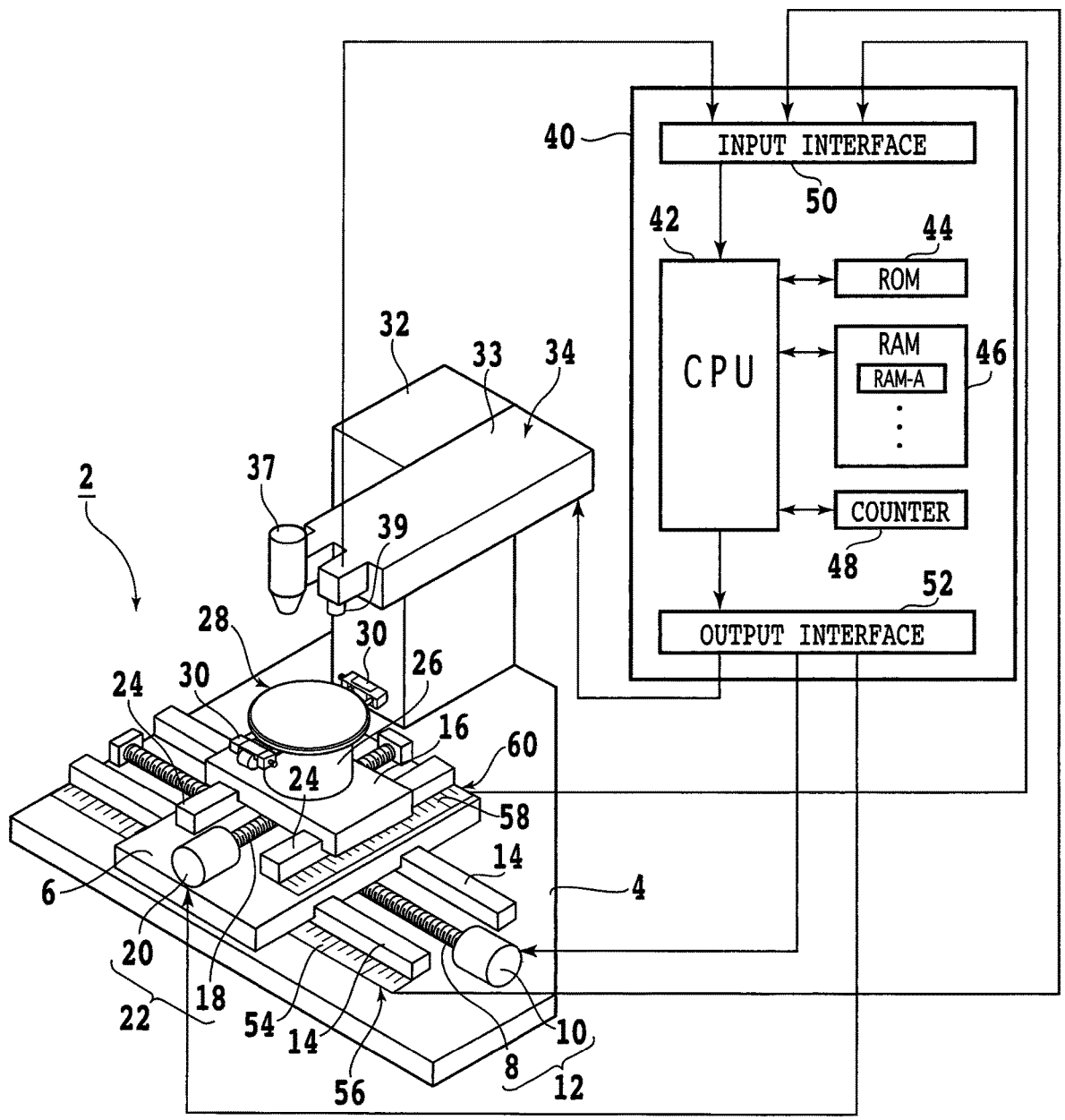
FIG. 1 is a perspective view of a laser processing apparatus.

Preferred embodiments of the present invention will now be described in detail with reference to the drawings. Referring to FIG. 1, there is depicted a schematic perspective view of a laser processing apparatus 2 according to a first preferred embodiment of the present invention. The laser processing apparatus 2 includes a stationary base 4 and a first slide block 6 supported to the stationary base 4 so as to be movable in an X direction depicted by an arrow X. The first slide block 6 is movable in a feeding direction, i.e., in the X direction along a pair of guide rails 14 by feeding means 12 including a ball screw 8 and a pulse motor 10.

A second slide block 16 is supported to the first slide block 6 so as to be movable in a Y direction depicted by an arrow Y. The second slide block 16 is movable in an indexing direction, i.e., in the Y direction along a pair of guide rails 24 by indexing means 22 including a ball screw 18 and a pulse motor 20. A chuck table 28 is supported through a cylindrical support member 26 to the second slide block 16. Accordingly, the chuck table 28 is movable both in the X direction and in the Y direction by the feeding means 12 and the indexing means 22. The chuck table 28 is provided with a pair of clamps 30 for clamping a semiconductor wafer held on the chuck table 28 under suction.

Figure 2:
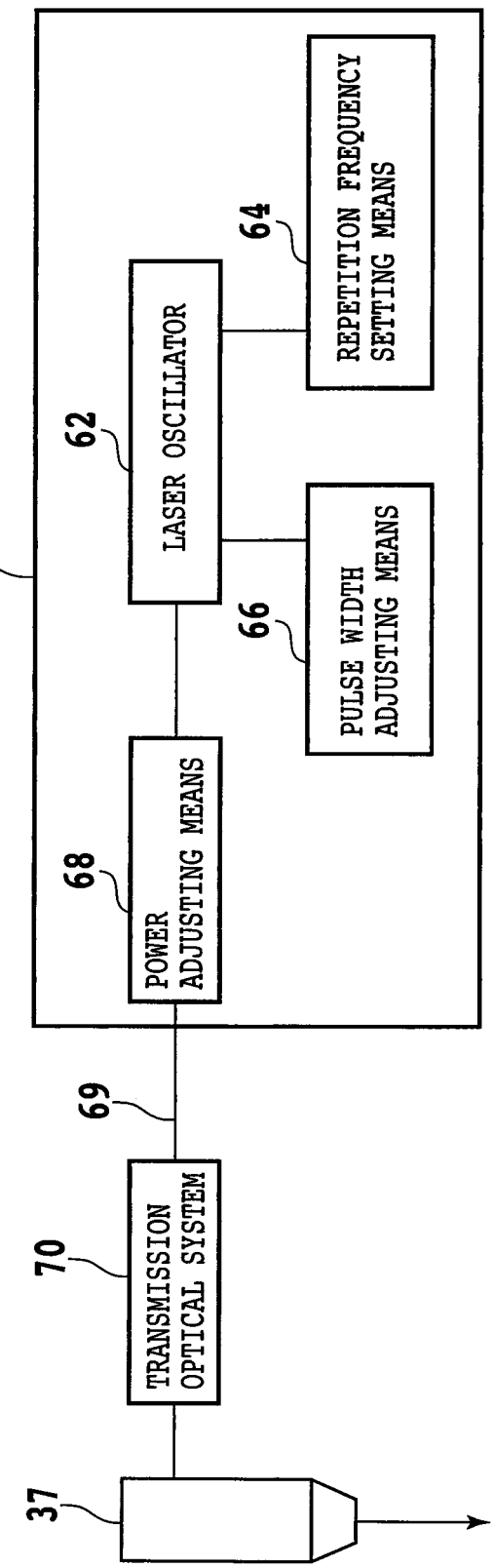
FIG. 2 is a block diagram of a laser beam generating unit.

A column 32 is provided on the stationary base 4, and a laser beam applying unit 34 is mounted on the column 32. The laser beam applying unit 34 includes a casing 33, a laser beam generating unit 35 (see FIG. 2) accommodated in the casing 33, and a processing head 37 mounted at the front end of the casing 33. As depicted in FIG. 2, the laser beam generating unit 35 includes a laser oscillator 62 such as a YAG laser oscillator and a YVO4 laser oscillator, repetition frequency setting means 64, pulse width adjusting means 66, and power adjusting means 68. Although not depicted, the laser oscillator 62 has a Brewster window, and it emits a laser beam of linearly polarized light.

Referring back to FIG. 1, imaging means 39 for detecting a target area of the semiconductor wafer to be laser-processed is also provided at the front end of the casing 33 so as to be juxtaposed to the processing head 37 in the X direction. The imaging means 39 includes an ordinary imaging device such as a charge-coupled device (CCD) for imaging the target area of the semiconductor wafer by using visible light. The imaging means 39 further includes infrared imaging means including infrared light applying means for applying infrared light to the semiconductor wafer, an optical system for capturing the infrared light applied to the semiconductor wafer by the infrared light applying means, and an infrared imaging device such as an infrared CCD for outputting an electrical signal corresponding to the infrared light captured by the optical system. An image signal output from the imaging means 39 is transmitted to a controller (control means) 40.

The controller 40 is configured by a computer, and it includes a central processing unit (CPU) 42 for performing operational processing according to a control program, a read only memory (ROM) 44 preliminarily storing the control program, a random access memory (RAM) 46 for storing the results of computation, etc., a counter 48, an input interface 50, and an output interface 52.

Reference numeral 56 denotes feed amount detecting means including a linear scale 54 provided along one of the guide rails 14 and a read head (not depicted) provided on the first slide block 6. A detection signal from the feed amount detecting means 56 is input into the input interface 50 of the controller 40. Reference numeral 60 denotes index amount detecting means including a linear scale 58 provided along one of the guide rails 24 and a read head (not depicted) provided on the second slide block 16. A detection signal from the index amount detecting means 60 is input into the input interface 50 of the controller 40. An image signal from the imaging means 39 is also input into the input interface 50 of the controller 40. On the other hand, control signals are output from the output interface 52 of the controller 40 to the pulse motor 10, the pulse motor 20, and the laser beam applying unit 34.

Figure 3:
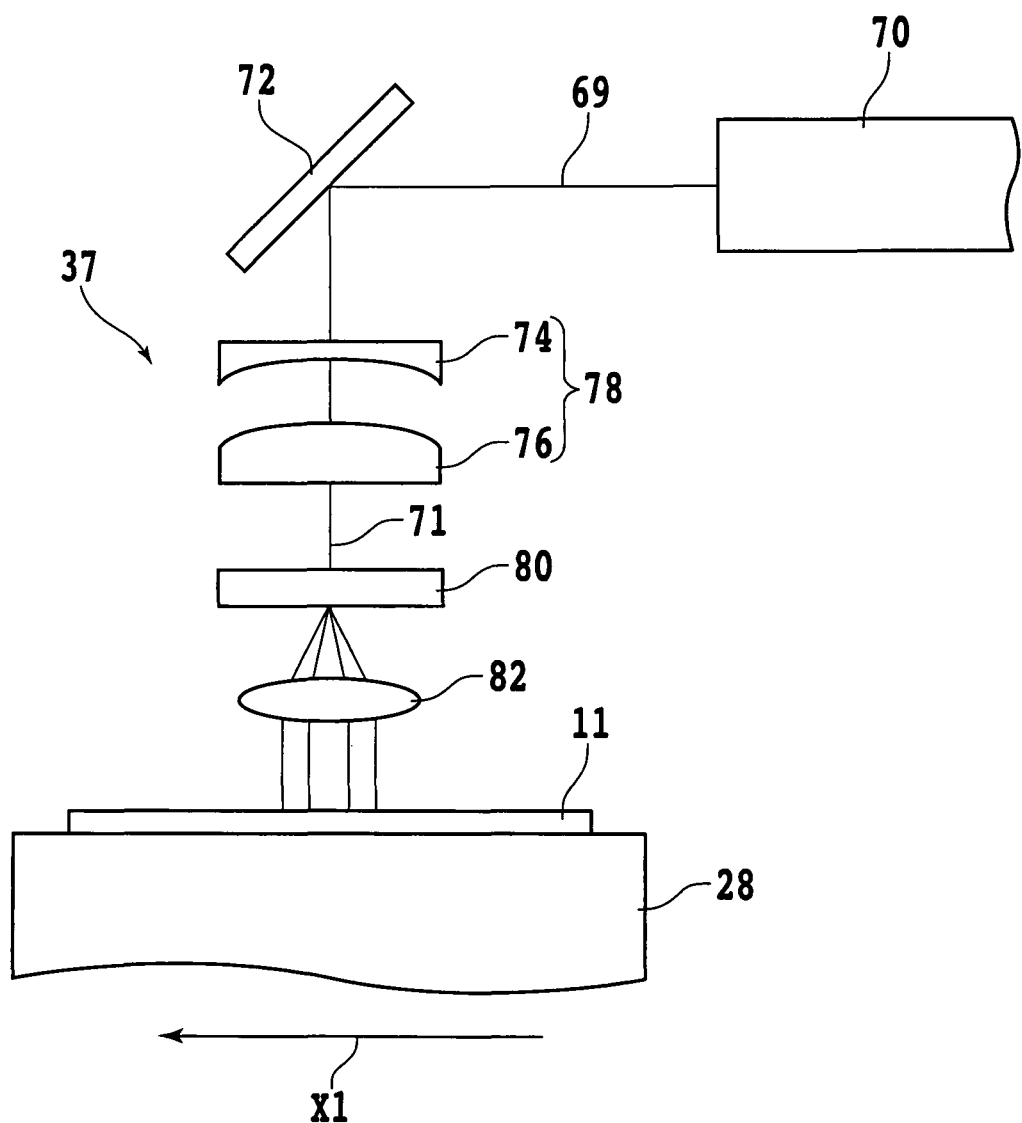
FIG. 3 is a schematic diagram of a processing head according to a first preferred embodiment of the present invention.

Referring to FIG. 3, there is depicted a schematic diagram of the processing head 37 according to the first preferred embodiment. As depicted in FIG. 2, the power of the pulsed laser beam oscillated from the laser oscillator 62 is adjusted to a predetermined power by the power adjusting means 68 of the laser beam generating unit 35, thus obtaining a pulsed laser beam 69. The pulsed laser beam 69 is next transmitted through a transmission optical system 70 to the processing head 37. The processing head 37 includes a mirror 72 for reflecting the incident pulsed laser beam 69 and elliptical spot forming means 78 for changing the spot shape of the pulsed laser beam 69 into an elliptical shape and making the major axis of the elliptical spot parallel to the feeding direction.

The elliptical spot forming means 78 includes a planoconcave cylindrical lens 74 and a planoconvex cylindrical lens 76. The incident pulsed laser beam 69 is linearly condensed and next diverged by the planoconcave cylindrical lens 74. After entering the planoconvex cylindrical lens 76, the pulsed laser beam is converted into a collimated beam (parallel rays of light) 71 having an elliptical spot (elliptical cross section) by the planoconvex cylindrical lens 76. Thereafter, the elliptical collimated beam 71 enters a diffractive optical element (DOE) 80, which functions to branch the collimated beam 71 into a plurality of pulsed laser beams (e.g., four pulsed laser beams in this preferred embodiment).

Thereafter, these plural pulsed laser beams branched above enter a condensing lens 82, which functions to condense each pulsed laser beam. Each pulsed laser beam condensed by the condensing lens 82 is applied to a wafer 11 held on the chuck table 28. The chuck table 28 is fed in the direction depicted by an arrow X1 in FIG. 3, thereby performing ablation along each division line of the wafer 11 to form a laser processed groove along each division line. In this preferred embodiment, it is important that the major axis of the elliptical spot of the pulsed laser beam is made parallel to the feeding direction by the elliptical spot forming means 78 including the planoconcave cylindrical lens 74 and the planoconvex cylindrical lens 76.

Figure 6:
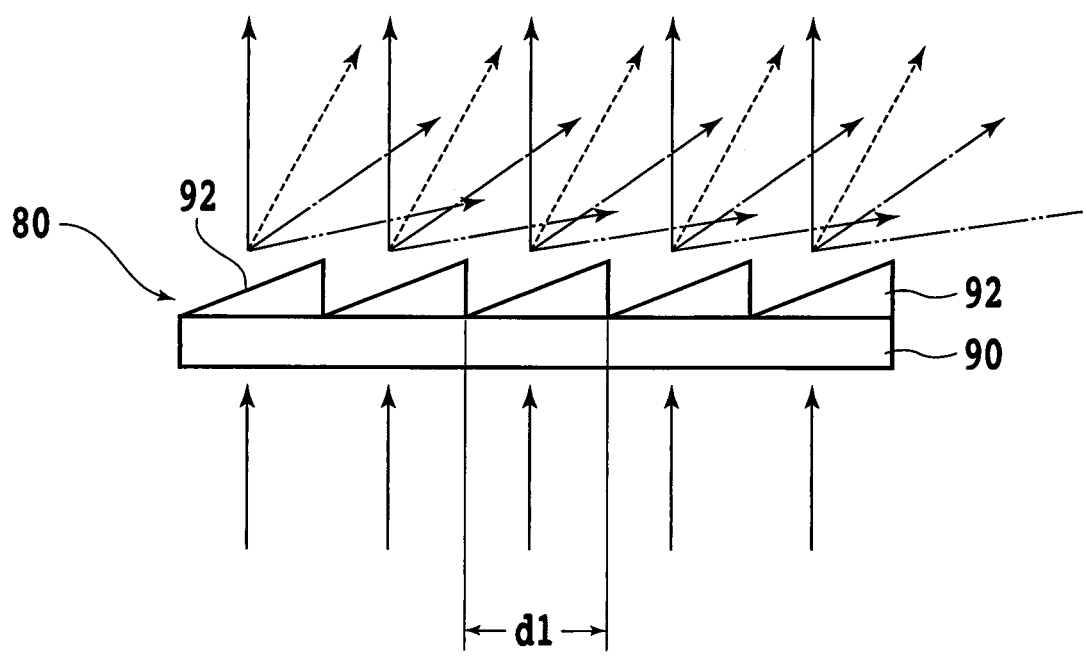
FIG. 6 is a schematic diagram of a blazed diffractive optical element (DOE)

Further, the plural pulsed laser beams branched by the DOE 80 are condensed along each division line of the wafer 11 by the condensing lens 82 in such a manner that the major axes of the elliptical spots of the plural pulsed laser beams condensed are partially overlapped. For example, the DOE 80 is configured by a blazed DOE as depicted in FIG. 6. The blazed DOE 80 depicted in FIG. 6 includes a transparent plate 90 and a sectionally sawtooth structure 92 formed on one side of the transparent plate 90 by micromachining. The dimension dl depicted in FIG. 6 is tens to hundreds of micrometers. According to this blazed DOE 80, the incident pulsed laser beam is branched into zero-order light, first-order light, second-order light, and third-order light. These four pulsed laser beams branched above are allowed to emerge from the blazed DOE 80. In FIG. 6, the branch angle of the four pulsed laser beams obtained by the blazed DOE 80 is exaggeratedly depicted.

Figure 4:
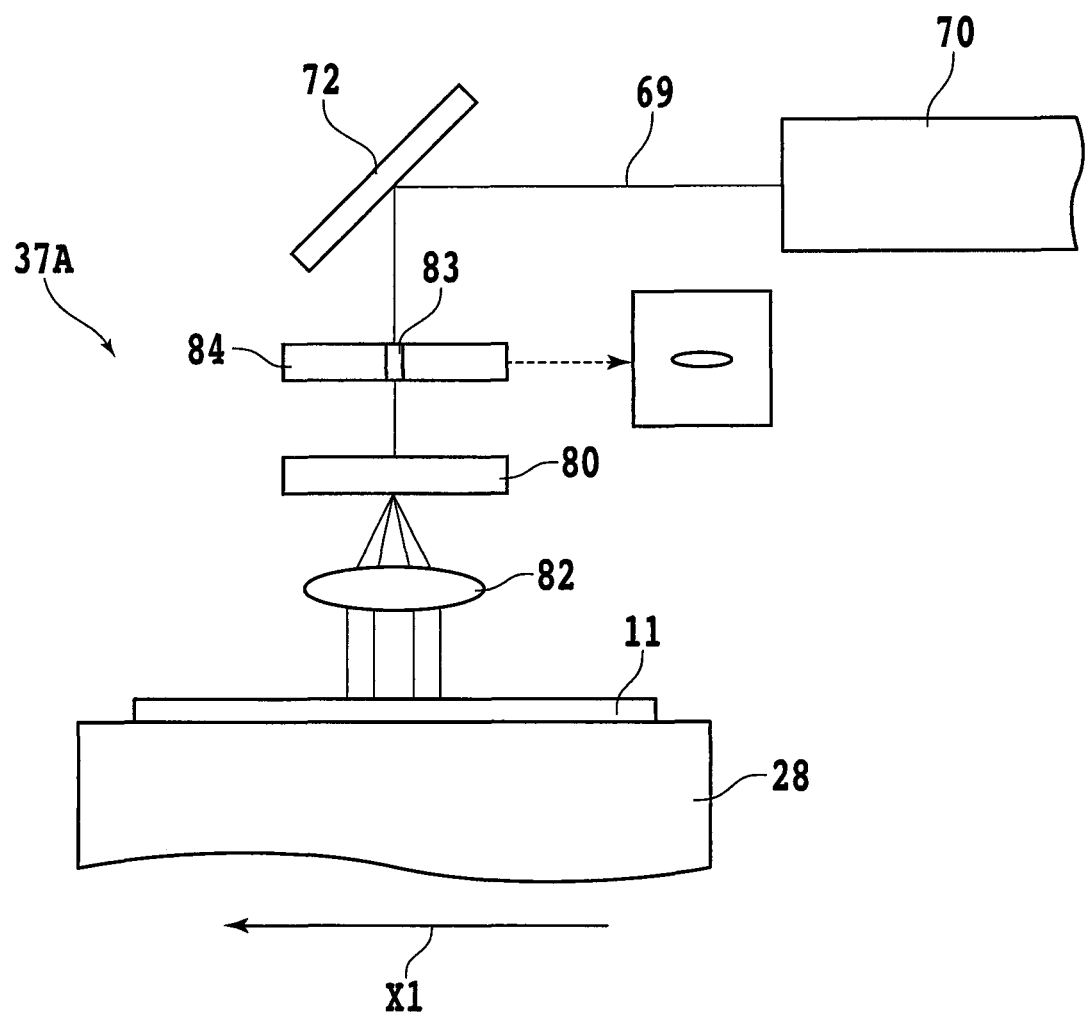
FIG. 4 is a schematic diagram of a processing head according to a second preferred embodiment of the present invention.

Referring to FIG. 4, there is depicted a schematic diagram of a processing head 37A according to a second preferred embodiment of the present invention. In this preferred embodiment, the processing head 37A includes a mask 84 having an elliptical slit 83 as the elliptical spot forming means. The pulsed laser beam 69 having a circular beam spot is converted into a pulsed laser beam having an elliptical spot by the pass through the elliptical slit 83 of the mask 84, wherein the major axis of the elliptical spot is made parallel to the feeding direction.

Figure 5:
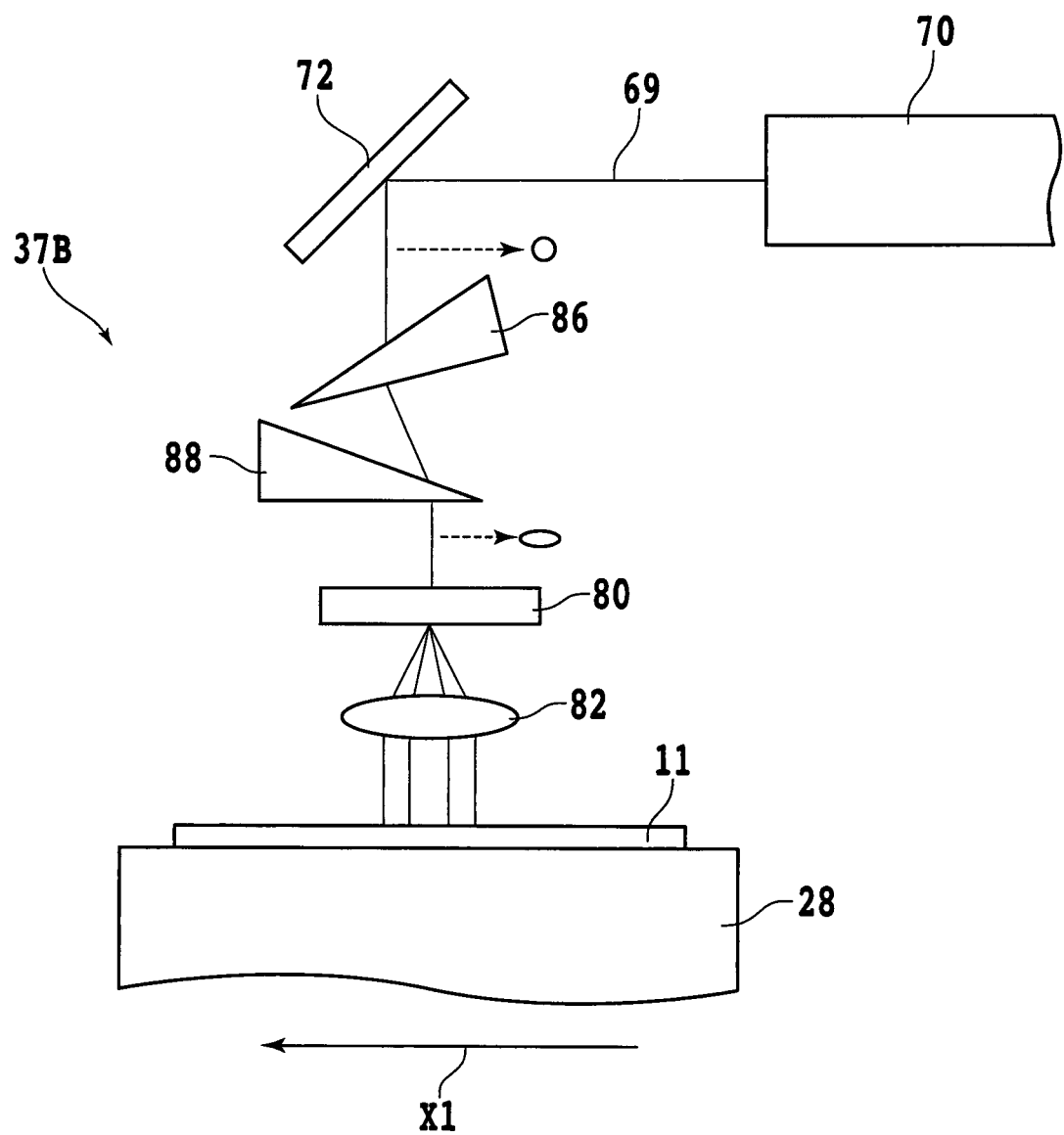
FIG. 5 is a schematic diagram of a processing head according to a third preferred embodiment of the present invention.

Referring to FIG. 5, there is depicted a schematic diagram of a processing head 37B according to a third preferred embodiment of the present invention. In this preferred embodiment, the processing head 37B includes two rectangular prisms 86 and 88 as the elliptical spot forming means. Each of the rectangular prisms 86 and 88 has a cross section of right-angled triangle. These two rectangular prisms 86 and 88 are arranged in optimum positional relation with each other, so that the pulsed laser beam 69 having a circular cross section (circular beam spot) can be converted into a pulsed laser beam having an elliptical cross section (elliptical beam spot), wherein the major axis of the elliptical beam spot condensed is made parallel to the feeding direction.

Figure 7:
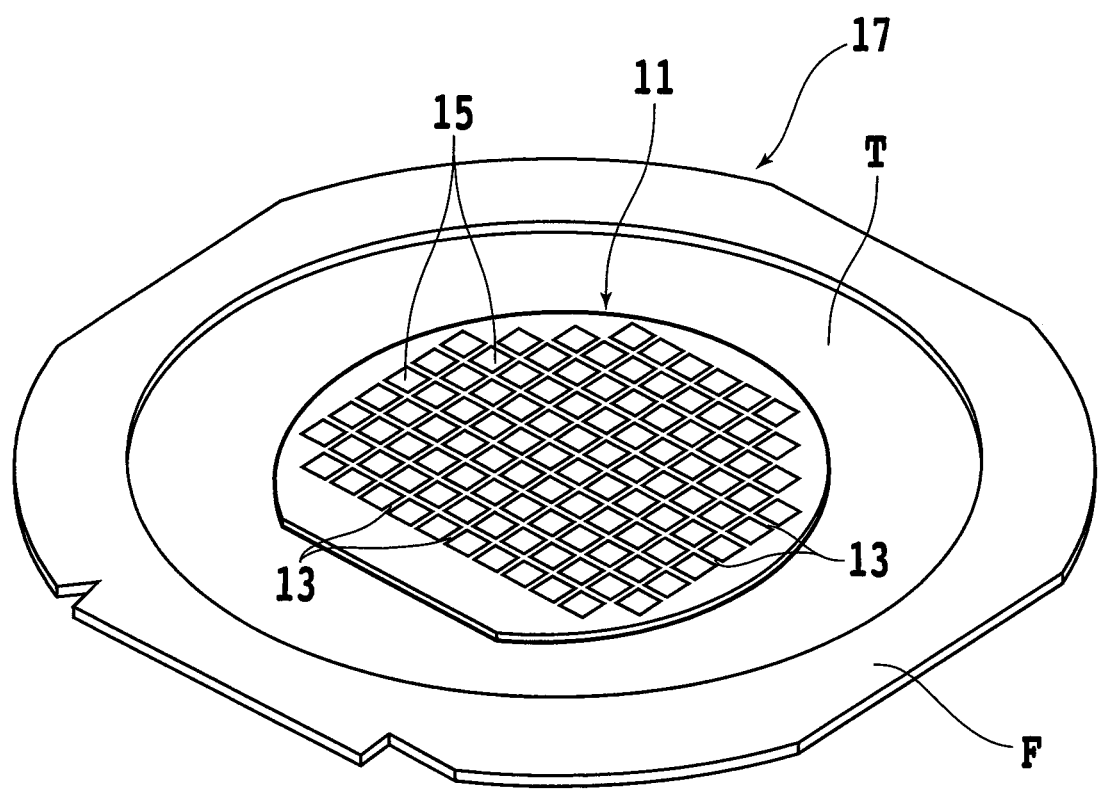
FIG. 7 is a perspective view of a wafer unit.

Referring to FIG. 7, there is depicted a perspective view of a wafer unit 17 obtained by attaching the back side of the wafer 11 to a dicing tape T whose peripheral portion is attached to an annular frame F. In a laser processing method according to a preferred embodiment of the present invention, the wafer unit 17 depicted in FIG. 7 is held on the chuck table 28 of the laser processing apparatus 2 in the condition where the front side of the wafer 11 is oriented upward. The wafer 11 is a silicon wafer or a sapphire wafer, for example. A plurality of devices 15 such as ICs, LSIs, and LEDs are formed on the front side of the wafer 11 so as to be separated from each other by a plurality of crossing division lines (streets) 13 extending in a first direction and a second direction perpendicular to the first direction. However, the workpiece to be processed by the laser processing method of the present invention is not limited to such a wafer. For example, a ceramic substrate having division lines on the front side may be used as the workpiece.

Figure 8:
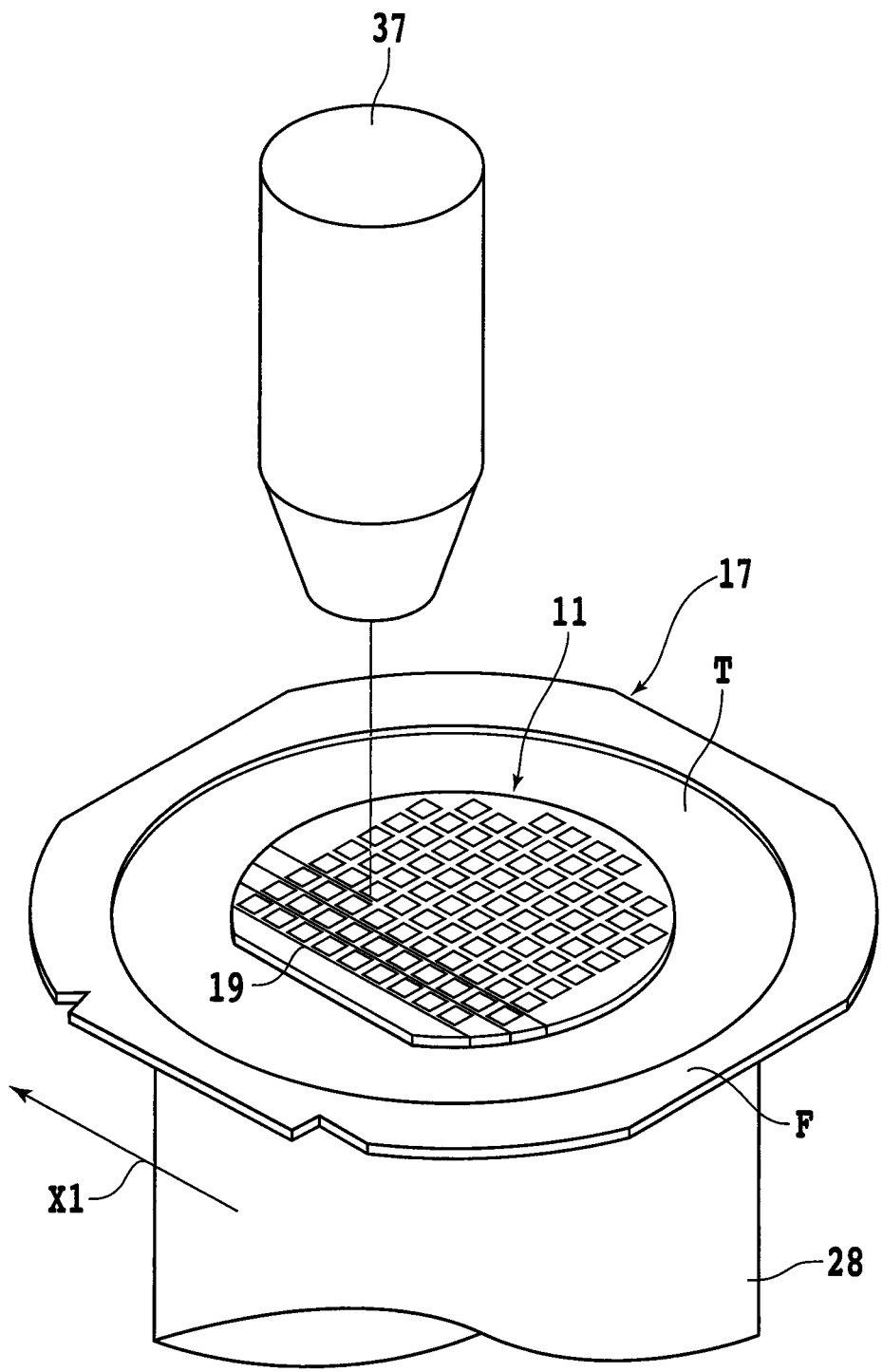
FIG. 8 is a perspective view for illustrating a laser processing method.
Figure 9A:
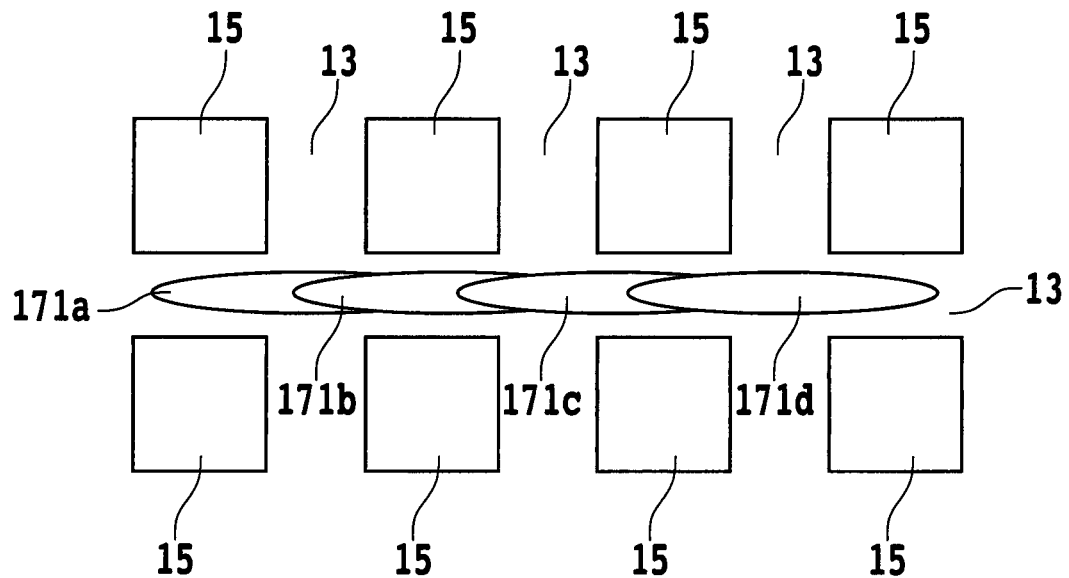
FIG. 9A is a schematic plan view depicting a positioning method for plural elliptical beam spots.

The laser processing method according to this preferred embodiment will now be described with reference to FIG. 8 and FIGS. 9A and 9B, wherein the laser processing apparatus 2 having the processing head 37 is used to form a laser processed groove along each division line 13 on the wafer 11. As depicted in FIG. 8, a pulsed laser beam having an absorption wavelength to the wafer 11 is focused and applied to each division line 13 on the wafer 11 by the processing head 37, and at the same time the chuck table 28 is moved (fed) in the direction depicted by an arrow X1 in FIG. 8 at a predetermined feed speed, thereby performing ablation along each division line 13 on the wafer 11 to form a laser processed groove 19 along each division line 13.

Prior to applying the pulsed laser beam to the wafer 11, an alignment step well known in the art is performed to make the first direction of the division lines 13 on the wafer 11 parallel to the X direction and then position a predetermined one of the division lines 13 extending in the first direction directly below the processing head 37. Accordingly, as depicted in FIG. 9A, the pulsed laser beam to be applied to the wafer 11 is formed as four elliptical beam spots 171a to 171d by the processing head 37. More specifically, the sectional shape of the pulsed laser beam is changed into an elliptical shape by the elliptical spot forming means 78. The pulsed laser beam having an elliptical cross section is next branched into four pulsed laser beams by the DOE 80. The four pulsed laser beams are next condensed to the front side of the wafer 11 by the condensing lens 82 so as to be arranged along the predetermined division line 13. Thus, the four elliptical beam spots 171*a* to 171*d* are formed along the predetermined division line 13 in such a manner that the major axes of these elliptical beam spots 171*a* to 171*d* are partially overlapped.

Preferably, each of the elliptical beam spots 171*a* to 171*d* has a size such that the major axis is set in the range of 10 to 1000 μm and the minor axis is set in the range of 5 to 12 μm. More preferably, the major axis is set in the range of 20 to 200 μm and the minor axis is set in the range of 5 to 9 μm. Further, as depicted in FIG. 9B, the overlap conditions of the elliptical beam spots 171*a* to 171*d* are set so that the ratio between the length L1 of the major axis and the pitch P1 of the elliptical beam spots 171*a* to 171*d* is preferably set to L1:P1=1:0.25 to 0.8, more preferably 1:0.25 to 0.5.

Figure 9B:
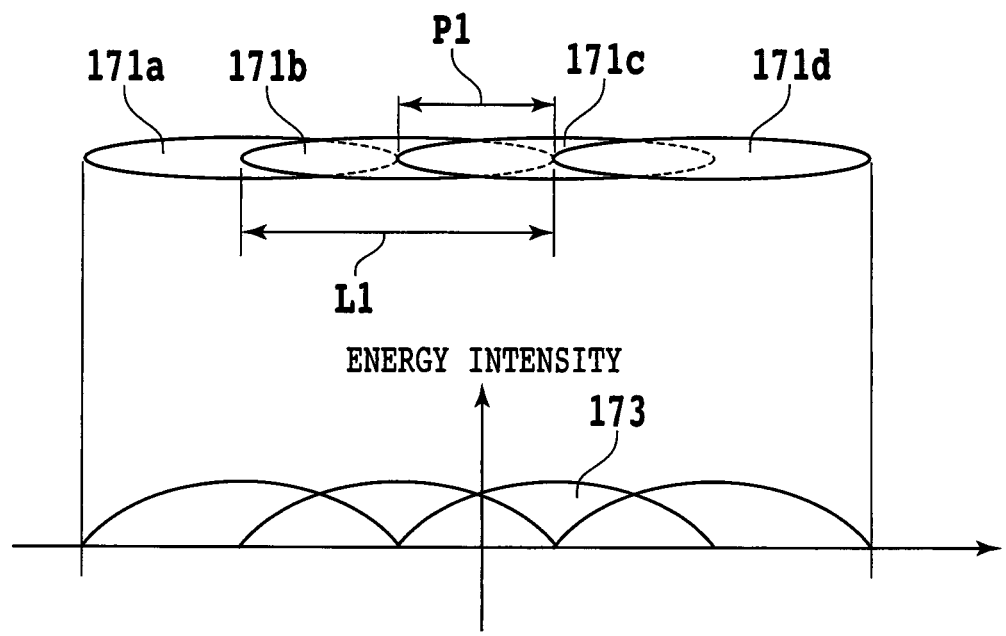
FIG. 9B is a schematic diagram depicting the distribution of energy intensity of the plural elliptical beam spots depicted in FIG. 9A.

Referring to FIG. 9B, there is also depicted an energy intensity distribution of the elliptical beam spots 171*a* to 171*d* of the four pulsed laser beams branched in this preferred embodiment. As apparent from FIG. 9B, the four elliptical beam spots 171*a* to 171*d* are partially overlapped to form a single elongated elliptical beam spot having a substantially constant energy intensity distribution in the feeding direction X1.

According to this preferred embodiment, the pulsed laser beam 69 is branched into the four pulsed laser beams by the DOE 80. Accordingly, even when the pulsed laser beam 69 has a relatively high power, the energy intensity of each of the four individual pulsed laser beams branched is reduced. Accordingly, the single elongated elliptical beam spot having such a reduced energy intensity distributed in the feeding direction X1 can be applied to the predetermined division line 13 on the wafer 11. In this condition, the chuck table 28 is moved in the feeding direction X1 to thereby perform ablation along the predetermined division line 13. Accordingly, the laser processed groove 19 having a small width can be formed along the predetermined division line 13.

For example, the laser processing mentioned above is performed under the following processing conditions.

Light source: YAG pulsed laser
Wavelength: 355 nm (third harmonic generation of YAG laser)
Power: 6.0 W
Repetition frequency: 20 kHz
Feed speed: 400 mm/second
Number of passes: 3

The laser processing is sequentially performed along all of the other division lines 13 extending in the first direction as indexing the chuck table 28 holding the wafer 11 in the Y direction, thereby forming a plurality of similar laser processed grooves 19 along all of the other division lines 13 extending in the first direction. Thereafter, the chuck table 28 is rotated 90 degrees to similarly perform the laser processing along all of the division lines 13 extending in the second direction perpendicular to the first direction, thereby forming a plurality of similar laser processed grooves 19 along all of the division lines 13 extending in the second direction.

According to the laser processing method mentioned above, the laser beam having a relatively high power is branched into plural laser beams, and these plural branched laser beams are applied as a single elongated elliptical beam spot to each division line 13 on the wafer 11, wherein the single elongated elliptical beam spot has a substantially constant intensity distribution in the feeding direction. In this condition, the chuck table 28 is moved in the feeding direction to thereby form the laser processed groove 19 along each division line 13 by ablation. Accordingly, a laser processing speed can be increased, and a narrow laser processed groove can be formed along each division line 13.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing apparatus comprising:
a chuck table for holding a workpiece;
laser beam applying means for applying a laser beam to said workpiece held on said chuck table;
feeding means for relatively moving said chuck table and said laser beam applying means in a feeding direction; and
control means for controlling said laser beam applying means and said feeding means;
said laser beam applying means including:
laser beam generating means for generating a pulsed laser beam,
elliptical spot forming means for changing a shape of a beam spot of said pulsed laser beam generated from said laser beam generating means into an elliptical shape and then making a major axis of said elliptical beam spot parallel to said feeding direction, said elliptical spot forming means including a planoconcave cylindrical lens having a concave surface and a first flat surface and a planoconvex cylindrical lens having a convex surface and a second flat surface, said planoconcave cylindrical lens and said planoconvex cylindrical lens being disposed such that the concave surface of said planoconcave cylindrical lens and the convex surface of said planoconvex cylindrical lens face each other, and wherein said pulsed laser beam is converted into a collimated laser beam by said planoconcave cylindrical lens and said planoconvex cylindrical lens;
a diffractive optical element for splitting said collimated laser beam having said elliptical beam spot obtained by said elliptical spot forming means, into a plurality of pulsed laser beams each having an elliptical beam spot whose major axis extends in said feeding direction, and
a condensing lens for condensing each of said pulsed laser beams split by said diffractive optical element, said condensing lens configured to condense said pulsed laser beams into simultaneous spaced pulsed laser beams on a surface of said workpiece in such a manner that said elliptical beam spots are simultaneously formed on said surface of said workpiece, wherein the major axes of said elliptical beam spots of said spaced, pulsed laser beams are partially overlapped to form a single elongated elliptical beam spot having a substantially constant energy intensity distribution in the feeding direction.

2. The laser processing apparatus according to claim 1, wherein each of said elliptical beam spots has a major axis in a range of 10 μm to 1000 μm and a minor axis in a range of 5 μm to 12 μm.

3. The laser processing apparatus according to claim 1, wherein each of said elliptical beam spots has a major axis in a range of 20 μm to 200 μm and a minor axis in a range of 5 μm to 9 μm.

4. The laser processing apparatus according to claim 1, wherein said condensing lens condenses said plural laser beams as simultaneous, non-diverging, pulsed laser beams on a surface of said workpiece and along each division line of said workpiece.

5. A laser processing method using a laser processing apparatus including a chuck table for holding a workpiece, laser beam applying means for applying a laser beam to said workpiece held on said chuck table, feeding means for relatively moving said chuck table and said laser beam applying means in a feeding direction, and control means for controlling said laser beam applying means and said feeding means, said laser beam applying means including laser beam generating means for generating a pulsed laser beam, elliptical spot forming means for changing a shape of a beam spot of said pulsed laser beam generated from said laser beam generating means into an elliptical shape and then making a major axis of said elliptical beam spot parallel to said feeding direction, the elliptical spot forming means including a planoconcave cylindrical lens having a concave surface and a first flat surface and a planoconvex cylindrical lens having a convex surface and a second flat surface, the planoconcave cylindrical lens and said planoconvex cylindrical lens being disposed such that the concave surface of the planoconcave cylindrical lens and the convex surface of the planoconvex cylindrical lens face each other, wherein said pulsed laser beam is converted to a collimated laser beam by said planoconcave cylindrical lens and said planoconvex cylindrical lens, a diffractive optical element for splitting said pulsed laser beam having said elliptical beam spot obtained by said elliptical spot forming means, into a plurality of pulsed laser beams each having an elliptical beam spot with a major axis that extends in said feeding direction, and a condensing lens for condensing each of said pulsed laser beams split by said diffractive optical element into non-converging, pulsed laser beams to said workpiece in such a manner that the major axes of said elliptical beam spots of said non-converging, pulsed laser beams are partially overlapped, wherein said workpiece has a plurality of crossing division lines and said laser beam is applied along each division line to form a laser processed groove along each division line, the laser processing method comprising:

a holding step of holding said workpiece on said chuck table;

a positioning step of arranging said elliptical beam spots of said plural pulsed laser beams split by said diffractive optical element and condensed by said condensing lens as simultaneous spaced, pulsed laser beams on a surface of said workpiece and along each division line of said workpiece in such a manner that said elliptical beam spots are simultaneously formed on said surface of said workpiece, wherein the major axes of said elliptical beam spots of said spaced, pulsed laser beams are partially overlapped to form a single elongated elliptical beam spot having a substantially constant energy intensity distribution in the feeding direction; and a feeding step of relatively feeding said plural pulsed laser beams and said chuck table along each division line after performing said positioning step.

6. The laser processing method according to claim 5, wherein each of said elliptical beam spots has a major axis in a range of 10 μm to 1000 μm and a minor axis in a range of 5 μm to 12 μm.

7. The laser processing method according to claim 5, wherein each of said elliptical beam spots has a major axis in a range of 20 μm to 200 μm and a minor axis in a range of 5 μm to 9 μm.

8. The laser processing method according to claim 5, wherein the positioning step includes condensing said plural laser beams by said condensing lens as simultaneous, non-diverging, pulsed laser beams on a surface of said workpiece and along each division line of said workpiece.

* * * * *